(12) United States Patent
Damitio et al.

(10) Patent No.: US 8,188,790 B1
(45) Date of Patent: May 29, 2012

(54) GATED CLASS H AMPLIFIER/LINE DRIVER SYSTEM AND METHOD

(75) Inventors: Paul G. Damitio, Tucson, AZ (US); Xavier P. Ramus, Tucson, AZ (US); He Qing, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/928,468

(22) Filed: Dec. 13, 2010

(51) Int. Cl.
H03G 3/20 (2006.01)

(52) U.S. Cl. ........................ 330/127; 330/297

(58) Field of Classification Search ............... 330/127, 330/297, 279, 134; 375/257, 222, 219
See application file for complete search history.

(56) References Cited

U.S. PATENT DOCUMENTS

| 6,636,103 B2 | 10/2003 | Wurcer et al. ............. 327/536 |
| 7,649,948 B2 * | 1/2010 | Hauptmann et al. .......... 375/257 |
| 2010/0267142 A1 * | 10/2010 | Wang et al. .................. 435/395 |

OTHER PUBLICATIONS

"A 684-mW Adaptive Supply Full-Rate ADSL CO Driver" by John Pierdomenico, Scott Wurcer and Bob Day, IEEE Journal of Solid-State Circuits, vol. 37, No. 12, Dec. 2002, pp. 1831-1838.
"High Efficiency Audio Power Amplifiers design and practical use" by Ronan van der Zee, © 1999, 128 pages. (Note: Only cover sheet attached).
"ITU G.992.1", article on DMT from Wikipedia, the free encyclopedia, 10 pages, Sep. 25, 2009.

* cited by examiner

*Primary Examiner* — Hieu Nguyen
(74) *Attorney, Agent, or Firm* — John J. Patti; Wade J. Brady, III; Frederick J. Telecky, Jr.

(57) ABSTRACT

Amplifier circuitry (10) includes a driver amplifier (11) and an integrator amplifier ($A_H$) producing an output signal ($V_{AH}$) that controls a pass transistor (Q2) coupled to a pump capacitor ($C_H$). Input circuitry (16) controls the direction of ramping of the output signal during a first interval to boost a supply voltage ($V_{12}$) of the driver amplifier via the pump capacitor, and also controls the direction of ramping to recharge the pump capacitor following a second interval. In one embodiment, pump capacitor recharging circuitry ($Q75, R76, I_{CCH}$) completes the recharging of the pump capacitor following the second interval after it has been partially recharged by the integrator amplifier.

20 Claims, 8 Drawing Sheets

GATED CLASS H AMPLIFIER/LINE DRIVER SYSTEM AND METHOD

BACKGROUND OF THE INVENTION

The present invention relates generally to class H amplifiers, and more particularly to improvements which improve their efficiency, reduce coupling of power supply signals into the amplifier outputs thereof, and increase the speed of operation while maintaining relatively low quiescent power consumption therein. The invention relates yet more particularly to improving the efficiency and performance of xDSL line driver circuits that include class H amplifiers. The term "xDSL" represents several variations of DSL (Digital Subscriber Line), including ADSL (Asymmetric Digital Subscriber Line), HDSL (High-bit-rate Digital Subscriber Line), VDSL (Very High-bit-rate Digital Subscriber Line), and other variations.

Prior Art FIG. 1 shows the circuitry for the positive supply of a conventional class G amplifier. Class G amplifiers are those which require multiple external power supplies. In FIG. 1, the high side supply voltage terminal 2 of an amplifier 1 is connected to the cathode of a switching diode D. The anode of diode D is connected to a relatively low magnitude first supply voltage $V_{CCL}$. Supply voltage terminal 2 of amplifier 1 also is connected to the emitter of an NPN pass transistor 3, the collector of which is connected to a relatively high magnitude second supply voltage $V_{CCH}$. The first supply voltage $V_{CCL}$ typically is chosen to have a value that most of the time is close to the average value of the amplifier output signal V. The second supply voltage $V_{CCH}$ is switched onto amplifier supply voltage terminal 2 whenever it is necessary to process a peak value of the amplifier signal voltage $V_{IN}$, which for example may be a DMT (discrete multi-tone) signal as illustrated in FIG. 3. A main shortcoming of conventional class G amplifiers is the doubling of the number of required power supplies and the associated total cost.

The graph of FIG. 3 illustrates various large-amplitude, short-duration signal peaks P that typically occur in a DMT signal. The illustrated signal peaks P are random and occur between low level adjacent portions of the signal to be amplified.

Prior Art FIG. 2 shows the circuitry for the positive supply of a conventional class H amplifier that includes switching diode D with its cathode connected to the high side supply voltage terminal 2 of amplifier 1. Terminal 2 also is connected to one plate of a capacitor C, which is sometimes referred to as a "pump capacitor" because it is used to pump up the supply voltage. The other plate of capacitor C is connected to the emitter of pass transistor 3 and to one terminal of a current source I having its other terminal connected to a low side supply voltage such as ground or $V_{EE}$. The collector of pass transistor 3 and the anode of switching diode D are connected to a single supply voltage $V_{CC}$.

Class H amplifiers are similar to class G amplifiers in that class H amplifiers also operate from a lower supply voltage than conventional Class AB amplifiers in order to achieve the same output voltage swing as conventional class AB amplifiers. But rather than requiring a separate high voltage supply, class H amplifiers use a charged capacitor C to supply the energy needed to process the signal peaks P (FIG. 3) received by driver amplifier 1. This is practical because the above mentioned signal peaks P are generally relatively infrequent and of short duration, thereby allowing adequate time for charging capacitor C between the signal peaks P.

A shortcoming of conventional class H amplifiers, especially when used to generate supply voltages to xDSL driver amplifiers, is that if pass transistor 3 is driven with a fast square wave, the class H amplifier raises and lowers the driver amplifier supply voltage (e.g., on high side terminal 2) too fast. It is well-known that the CMRR (common mode rejection ratio) and PSRR (power supply rejection ratio) of an amplifier deteriorate as the signal frequency is increased, and it can be shown that the output signal of an amplifier may be distorted if its supply voltages are raised or lowered too quickly. Because of the finite power supply rejection capability of the xDSL driver amplifier 1, a fast dV/dt signal on its power supply rail(s) can be coupled into the amplifier output and cause distortion in the output signal. Furthermore, too much time is required for the current source I in FIG. 2 to recharge capacitor C if it is substantially discharged. There is a difficult trade-off between the magnitude of the current source I and the amount of time required to recharge the capacitor C because increasing the magnitude of current source I increases the power consumption. A conventional class H xDSL line driver typically has both its upper and lower supply voltages generated by upper and lower class H amplifiers, respectively, of the general type shown in FIG. 2.

Line drivers targeted at the xDSL market typically have employed a class AB output stage to achieve the power and linearity requirements of these applications. If the quiescent power of the line driver is assumed to be zero and the output signal $V_O$ can be driven all the way to the high side and low side supply rails, then the class AB output stage is about 78% efficient when driving a sinusoidal output signal into a load. The efficiency is given by the following equation:

$$\eta_{AB} = \frac{\pi V_O}{4 V_{CC}} \times 100\%. \qquad \text{Equation (1)}$$

It can be seen from Equation (1) that as $V_O$ becomes less than the supply voltage $V_{CC}$, the efficiency $\eta_{AB}$ progressively decreases. Equation (1) can be used to calculate the class AB output stage efficiency $\eta_{AB}$ as it pertains to a typical DMT signal. The VDSL2 down stream "Profile 8b" is an amalgam of quadrature amplitude modulated (QAM) tones which are spaced 4.3125 kHz apart. The tones are uncorrelated and there are a large number of them, so the amplitude distribution can be approximated as being Gaussian. The DMT signal is comprised of many individual tones (not shown in FIG. 3), and when these tones randomly become aligned in phase, a signal peak P occurs as shown in FIG. 3. The combination of all such aligned tones P produces a high peak-to-average ratio (PAR) signal. For example, a typical PAR for "Profile 8b" has a value of 5.5. (Profile 8b is one of the parameter specifications defined in the Telecommunications Standardization Sector (ITU) G.993.2 for VDSL2. Profile 8b is the highest power and thus stands to benefit the most from class H power efficiency.)

Equation (1) may be used to approximate what happens to the efficiency $\eta_{AB}$ of the class AB stage when it is used with a high PAR (peak-to-average ratio) signal. For example, if $V_O$ is equal to $V_{CC}$/PAR, Equation (1) indicates an efficiency $\eta_{AB}$ of only 14%. One known technique that may be considered to improve this situation is to decrease $V_{CC}$ such that it is closer to the average value of the signal being amplified and then switch to a higher supply when it is necessary to process a signal peak P. The main disadvantage of this technique is that the signal fidelity may be substantially degraded.

The operation of the class G and class H amplifiers shown in FIGS. 1 and 2, respectively, can be described as either "tracking" operation or "gated" operation. If the amplifier is tracking (which is the method described in subsequently mentioned U.S. Pat. No. 6,636,103), it must monitor the input signal $V_{IN}$, and be able to raise the supply voltage magnitude high enough and quickly enough to prevent the amplifier output signal $V_{OUT}$ from being clipped. This becomes more and more difficult to implement as the frequency content of the signal being amplified increases, and is relatively unfeasible with frequencies much above 12 MHZ for amplifiers fabricated using state-of-the-art integrated circuit process technology.

Considering a gated topology used in conjunction with the amplifiers shown in FIGS. 1 and 2, the high side supply voltage is switched in when needed, for example, by using a look-ahead signal provided by an external processor or a chip-set that drives the line driver integrated circuit. Typically, the processor or chip-set can be "aware" of signal characteristics such as the above mentioned peaks, up to approximately 400 nanoseconds before they actually appear at the input of the driver amplifier. Therefore, the gated amplifier can be alerted to the presence of a signal peak well in advance of the instant at which it arrives at the input of the driver amplifier. This can greatly reduce the needed bandwidth required for a "tracking" approach, and hence can reduce the power required to temporarily switch a high supply voltage to the appropriate supply voltage terminal of the driver amplifier.

Although there are various advantages and disadvantages to using both class G and class H amplifier topologies, many users tend to prefer the class H topology because it does not require doubling of the number of power supplies (one for the high side driver amplifier supply voltage and one for the low side driver amplifier supply voltage).

Above-mentioned U.S. Pat. No. 6,636,103, entitled "Amplifier System with On-Demand Power Supply Boost" and issued Oct. 21, 2003 to Wurcer et al., discloses an amplifier circuit wherein the supply voltages are raised automatically rather than by a signal generated by the processor. This makes the amplifier circuit easier to use, but the circuitry required to implement the technique disclosed in the '103 patent requires considerably higher power than is acceptable in many applications in which reduced power consumption is more important than ease of use.

Thus, there is an unmet need for a class H amplifier having improved efficiency of operation.

There also is an unmet need for an improved xDSL line driver circuit of the kind including a class H amplifier and having improved efficiency of operation.

There also is an unmet need for an improved, lower cost xDSL line driver circuit of the kind including a class H amplifier and having improved efficiency of operation.

There also is an unmet need for an improved class H amplifier which minimizes the coupling of the varying power supply signals into the driver amplifier output.

There also is an unmet need for an improved xDSL line driver circuit of the kind including a class H amplifier and having improved efficiency of operation and capable of increased operating speed while maintaining relatively low quiescent power.

SUMMARY OF THE INVENTION

It is an object of the invention to provide a class H amplifier having improved efficiency of operation.

It is another object of the invention to provide an improved xDSL line driver circuit of the kind including a class H amplifier and having improved efficiency of operation.

It is another object of the invention to provide an improved, lower cost xDSL line driver circuit of the kind including a class H amplifier and having improved efficiency of operation.

It is another object of the invention to provide an improved class H amplifier which minimizes the coupling of power supply signals into the driver amplifier output.

It is another object of the invention to provide an improved xDSL line driver circuit of the kind including a class H amplifier and having improved efficiency of operation and capable of increased operating speed while maintaining relatively low quiescent power.

It is another object of the invention to provide an improved xDSL line driver circuit of the kind including a class H amplifier and having improved ability to quickly charge a pump capacitor.

Briefly described, and in accordance with one embodiment, the present invention provides amplifier circuitry (10) including a driver amplifier (11) and an integrator amplifier ($A_H$) producing an output signal ($V_{AH}$) that controls a pass transistor (Q2 coupled to a pump capacitor ($C_H$). Input circuitry (16) controls the direction of ramping of the output signal during a first interval to boost a supply voltage ($V_{12}$) of the driver amplifier via the pump capacitor. In one embodiment, pump capacitor recharging circuitry (Q75,R76,$I_{CHH}$) completes the recharging of the pump capacitor following the second interval after it has been partially recharged by the integrator amplifier.

In one embodiment, the invention provides amplifier circuitry (10) powered by a first supply voltage ($V_{CC}$) and a second supply voltage ($V_{EE}$), including a driver amplifier (11) for amplifying an input signal ($V_{IN}$) to generate an output signal ($V_{OUT}$), the driver amplifier (11) having a first supply terminal (12) for conducting a first driver amplifier supply voltage ($V_{12}$) and a second supply terminal (13) for conducting a second driver amplifier supply voltage ($V_{13}$). The amplifier circuitry (10) includes first amplifier circuitry (22A) including a first integrator amplifier ($A_H$) and associated first integrating capacitor (C0) for producing a first output signal ($V_{AH}$), and a first pass transistor (Q2) having a control electrode coupled to the first output signal ($V_{AH}$). A first pump capacitor ($C_H$) has a first terminal (12) coupled to the first supply terminal (12) and the first supply voltage ($V_{CC}$) and a second terminal (35) coupled to a first electrode of the first pass transistor (Q2). Input circuitry (16) controls both a direction of ramping of the first integrator amplifier ($A_H$) during a first ramping interval to produce increased amplitude of the first driver amplifier supply voltage ($V_{12}$) and a direction of ramping of the first integrator amplifier ($A_H$) during a second ramping interval to produce re-charging of the first pump capacitor ($C_H$) in response to a control signal ($V_{H\_EN}$). The input circuitry (16) also includes switching circuitry (SW1, $I_{BIAS}$,SW2) having an input coupled to receive the control signal ($V_{H\_EN}$), first current mirror circuitry (Q17,Q16) having an input (23) coupled to the switching circuitry (SW1, $I_{BIAS}$,SW2) and an output (21) coupled to a first input (−) of the first integrator amplifier ($A_H$). The input circuitry (16) also includes second current mirror circuitry (Q43,Q42) having an input (20) coupled to the switching circuitry (SW1, $I_{BIAS}$,SW2) and an output (21) coupled to the first input (−) of the first integrator amplifier ($A_H$).

In a described embodiment, the first pass transistor (Q2) is an NPN transistor having a base coupled to the first output signal ($V_{AH}$), a collector coupled to the first supply voltage ($V_{CC}$), and an emitter coupled the second terminal (35) of the first pump capacitor ($C_H$). The first amplifier circuitry (22A) includes a first pump capacitor recharging path including a first diode (D13) with an anode coupled to the second terminal (35) of the first pump capacitor ($C_H$) and a cathode (32) coupled to the first output signal ($V_{AH}$) by a first resistor (R0). The first terminal (12) of the first pump capacitor ($C_H$) is coupled to the cathode of a second diode (D0) having an anode coupled to the first supply voltage ($V_{CC}$).

In one embodiment, the first integrating capacitor (C0) is coupled between an output (26) of the first integrating amplifier ($A_H$) and the first input (−) of the first integrator amplifier ($A_H$). The amplifier circuitry includes a first clamping transistor (Q67) having a control electrode (29) coupled to a first reference voltage (V0), a first electrode coupled to the first (−) input of the first integrator amplifier ($V_{AH}$), and a second electrode coupled to the output (26) of the first integrating amplifier ($V_{AH}$). The first clamping transistor (Q67) is an NPN transistor having an emitter coupled to the output (26) of the first integrator amplifier ($A_H$), a collector coupled to the first input (−) of the first integrator amplifier ($A_H$), and a base coupled to the first reference voltage (V0), and the first reference voltage (V0) has a value slightly below a voltage at which the first pass transistor (Q2) turns on.

In one embodiment, a first comparator (40) has a first input (+) coupled to indicate when the first output signal ($V_{AH}$) has completed the first ramping interval and an output coupled to then reduce an amount of current flowing into a first supply voltage terminal (45A) of the first integrator amplifier ($A_H$). A second input (+) of the first integrator amplifier ($V_{AH}$) is coupled to a mid-range reference voltage ($V_{MID}$) and a protection diode (D8) is coupled between the first (−) and second (+) inputs of the first integrator amplifier ($V_{AH}$).

In one embodiment, the first amplifier circuitry (22A) includes first pump capacitor recharging circuitry (Q75,R76, $I_{CHH}$) for topping off recharging of the first pump capacitor ($C_H$) after it has been partially recharged by the first integrator amplifier ($V_{AH}$) following the second ramping interval. In one embodiment, the first pump capacitor recharging circuitry (Q75,R76,$I_{CHH}$) includes recharging current source circuitry (Q75,$I_{CHH}$) coupled between the second terminal (35) of the first pump capacitor ($C_H$) and the second supply voltage ($V_{EE}$) for further recharging the first pump capacitor ($C_H$) when the first pump capacitor (CH) has charged to a point such that (D13) has become reverse biased and the first output signal ($V_{AH}$) is no longer able to provide recharge current to first pump capacitor (CH) in one embodiment, the recharging current source circuitry (Q75,$I_{CHH}$) includes a fixed current source ($I_{CHH}$) producing a fixed recharging current for the further recharging of the first pump capacitor ($C_H$).

In one embodiment, the switching circuitry (SW1,$I_{BIAS}$, SW2) includes a first switch (SW1) having a pole terminal coupled to one terminal of a bias current source ($I_{BIAS}$) and a first terminal coupled to the input (23) of the first current mirror circuitry (Q17,Q16), and a second switch (SW2) having a pole terminal coupled to another terminal of the bias current source ($I_{BIAS}$) and a first terminal coupled to the input (20) of the second current mirror circuitry (Q17,Q16).

In one embodiment, the amplifier circuitry (10) includes second amplifier circuitry (22B) including a second integrator amplifier ($A_L$) and associated second integrating capacitor (C1), and a second pump capacitor ($C_L$) having a first terminal coupled to the second apply terminal (13) and a second terminal coupled to an output ($V_{AL}$) of the second integrator amplifier ($A_L$). In that described embodiment, the input circuitry (16) includes third current mirror circuitry (Q4,Q3) having an input (24) coupled to the switching circuitry (SW1, $I_{BIAS}$,SW2) and an output (18) coupled to a first input (−) of the second integrator amplifier ($A_L$), and fourth current mirror circuitry (Q19,Q18) having an input (17) coupled to the switching circuitry (SW1,$I_{BIAS}$,SW2) and an output (18) coupled to the first input (−) of the second integrator amplifier ($A_L$).

In one embodiment, the control signal ($V_{H\_EN}$) is generated by an external processor (13) to indicate an imminent peak (P) of the input signal ($V_{IN}$).

In one embodiment, the invention provides a method for operating amplifier circuitry (10) powered by a first supply voltage ($V_{CC}$) and a second supply voltage ($V_{EE}$) to process high magnitude peak voltages of an input signal ($V_{IN}$), the method including ramping a first output signal ($V_{AH}$) of a first integrator amplifier ($A_H$) of the amplifier circuitry (10) in a first direction during a first ramping interval in anticipation of a high magnitude peak level (P) of the input signal ($V_{IN}$); coupling the first output signal ($V_{AH}$) produced by the first integrator amplifier ($A_H$) during the first ramping interval through a pass transistor (Q2) to a first terminal (35) of a first pump capacitor ($C_H$) to discharge the first pump capacitor ($C_H$) into a first terminal (12) of a driver amplifier (11) to boost a first supply voltage ($V_{12}$) thereof; amplifying the high magnitude peak level (P) of the input signal ($V_{IN}$) by means of the driver amplifier (11) after the boosting; ramping the first output signal ($V_{AH}$) of the first integrator amplifier ($A_H$) in a second direction during a second ramping interval after the amplifying; and coupling a second terminal (12) the first pump capacitor ($C_H$) to the first supply voltage ($V_{CC}$) by means of a first diode (D0) during the ramping to cause the first integrator amplifier ($A_H$) to recharge the first pump capacitor ($C_H$) during the second ramping interval.

In one embodiment, the first integrating capacitor (C0) is coupled between an output (26) of the first integrating amplifier ($A_H$) and the first input (−) of the first integrator amplifier ($A_H$), and the method includes limiting low excursions of the first output signal ($A_H$) to a level just sufficient to turn the pass transistor (Q2) off during the recharging of the first pump capacitor ($C_H$).

In one embodiment, the method includes determining when the first output signal ($V_{AH}$) has completed the first ramping interval and then reducing an amount of current flowing into a first supply voltage terminal (45A) of the first integrator amplifier ($A_H$).

In one embodiment, the method includes topping off the recharging of the first pump capacitor ($C_H$) by means of a constant current source ($I_{CCH}$ after the first pump capacitor ($C_H$) has been partially recharged by the first integrator amplifier ($V_{AH}$) during the second ramping interval.

In one embodiment, the method includes ramping a first output signal ($V_{AH}$) of the a second integrator amplifier ($A_L$) in a second direction during the first ramping interval in anticipation of an opposite-polarity high magnitude peak level (P) of the input signal ($V_{IN}$); coupling a signal representative of the first output signal ($V_{AH}$) produced by the second integrator amplifier ($A_L$) during the first ramping interval to a second terminal (36) of a second pump capacitor ($C_L$) to discharge the second pump capacitor ($C_L$) into a second terminal (13) of the driver amplifier (11) to boost a second supply voltage ($V_{13}$) thereof; signal ($V_{IN}$) by means of the driver amplifier (11) after the boosting of the second supply voltage ($V_{13}$); ramping the second output signal ($V_{AH}$) of the second integrator amplifier ($A_L$) during the second ramping interval after the amplifying of the opposite-polarity high magnitude peak level (P) of the input signal ($V_{IN}$); and coupling a second terminal (13) the second pump capacitor ($C_L$) to the second supply voltage ($V_{EE}$) by means of a second diode (D2) during that ramping to cause the second integrator amplifier ($A_{AL}$) to recharge the second pump capacitor ($C_L$) during the second ramping interval.

In one embodiment, the invention provides amplifier circuitry (10) powered by a first supply voltage ($V_{CC}$) and a second supply voltage ($V_{EE}$) to process high magnitude peak voltages of an input signal ($V_{IN}$), the amplifier circuitry (10) including means (16,C0) for ramping a first output signal ($V_{AH}$) of a first integrator amplifier ($A_H$) of the amplifier circuitry (10) in a first direction during a first ramping interval in anticipation of a high magnitude peak level (P) of the input signal ($V_{IN}$); means (Q2) for coupling the first output signal ($V_{AH}$) produced by the first integrator amplifier ($A_H$) during the first ramping interval through a pass transistor (Q2) to a first terminal (35) of a first pump capacitor ($C_H$) to discharge the first pump capacitor ($C_H$) into a first terminal (12) of a driver amplifier (11) to boost a first supply voltage ($V_{12}$) thereof; means (11) amplifying the high magnitude peak level (P) of the input signal ($V_{IN}$) by means of the driver amplifier (11) after the boosting; means (16) for ramping the first output signal ($V_{AH}$) of the first integrator amplifier ($A_H$) in a second direction during a second ramping interval; and means (D0) for coupling a second terminal (12) the first pump capacitor ($C_H$) to the first supply voltage ($V_{CC}$) by means of a first diode (D0) to cause the first integrator amplifier ($A_H$) to recharge the first pump capacitor ($C_H$) during the second ramping interval.

DETAILED DESCRIPTION OF THE PREFERRED EMBODIMENTS

Figure 4:
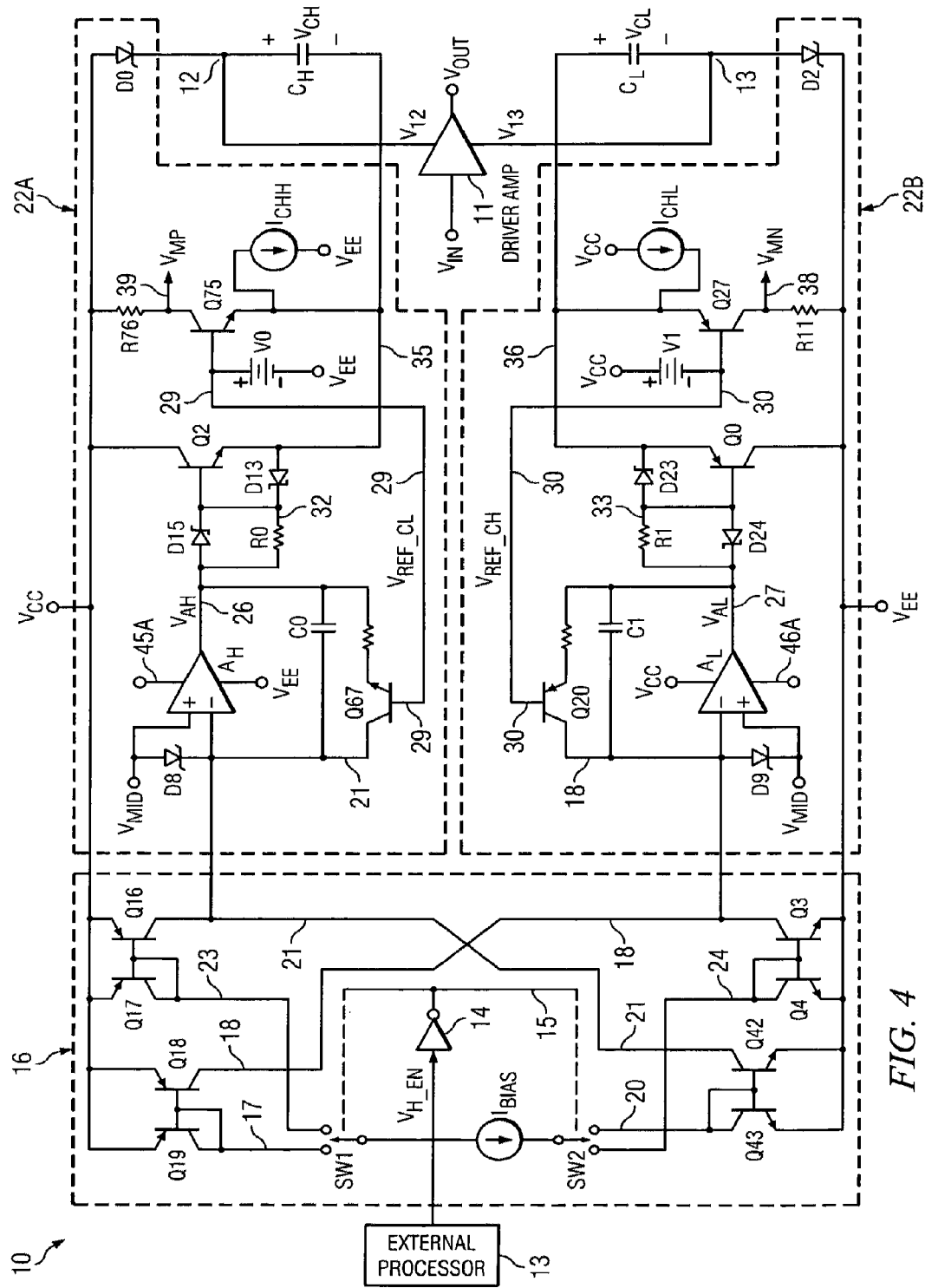
FIG. 4 is a schematic diagram of a line driver circuit of the present invention.

Referring to FIG. 4, an xDSL line driver 10 includes a driver amplifier 11 which amplifies an input signal $V_{IN}$ to produce an output signal $V_{OUT}$. Driver amplifier 11 has a high side voltage supply terminal 12 to which a supply voltage $V_{12}$ is applied and a low side voltage supply terminal 13 to which a supply voltage $V_{13}$ is applied. Class H circuitry in FIG. 4 includes high side class H switching circuitry 22A which generates supply voltage $V_{12}$, and low side class H switching circuitry 22B which generates supply voltage $V_{13}$. Input circuit 16 controls the ramp-up and ramp-down rates of integrator amplifiers $A_H$ and $A_L$ in response to a control signal $V_{H\_EN}$.

High side class H switching circuitry 22A includes an integrator amplifier $A_H$ having an output 26 coupled to the base of an NPN pass transistor Q2. An external capacitor $C_H$, sometimes referred to as pump capacitor $C_H$, is coupled between the emitter of a pass transistor Q2 and the high side supply voltage $V_{12}$ on terminal 12. An integrating capacitor C0 is coupled between the output 26 and (−) input of integrator amplifier $A_H$. The (+) input of integrator amplifier $A_H$ is coupled to a voltage $V_{MID}$ (which is an internally generated voltage that is equal to $V_{CC}/2$) and the anode of a Schottky diode D8, the anode of which is connected by conductor 21 to the (−) input of amplifier $A_H$, one plate of integrating capacitor C0, the collector of an NPN clamping transistor Q67, the collector of a PNP current mirror output transistor Q16 of the input circuit 16, and the collector of an NPN current mirror output transistor Q42 of input circuit 16. Schottky diode D8 clamps the differential input voltage of amplifier $A_H$ to about 0.4 volts so it does not saturate. (Schottky diodes preferably are used because of their lower forward voltages.)

Input circuit 16 also includes transistors Q3, Q4, Q16, Q17, Q18, Q19, Q42, and Q43. The emitter of transistor Q42 is connected to $V_{EE}$. The emitter of transistor Q16 also is connected to $V_{CC}$, and its base is connected by conductor 23 to one terminal of a switch SW1 and to the base and collector of PNP current mirror input transistor Q17, the emitter of which is connected to $V_{CC}$. Another terminal of switch SW1 is connected by conductor 17 to the collector and base of PNP current mirror input transistor Q19 and the base of a PNP current mirror output transistor Q18, the emitter of which is connected to $V_{CC}$. The emitter of transistor Q19 is connected to $V_{CC}$. The collector of transistor Q18 is connected by conductor 18 to the collector of NPN current mirror output transistor Q3, the emitter of which is connected to $V_{EE}$. Conductor 18 is also connected to the (−) input of integrator amplifier $A_L$.

The output of integrator amplifier $A_H$ generates a signal $V_{AH}$ on conductor 26, which is connected by a resistor to the emitter of clamping transistor Q67. Conductor 26 also is connected to the anode of a Schottky diode D15. Conductor 26 also is coupled by a resistor R0 and conductor 32 to the cathode of Schottky diode D15, the cathode of Schottky diode D13, and the base of pass transistor Q2. Series resistor R0 limits the subsequently described peak "recharge" current through conductor 35 such that it does not produce excessive glitches in the driver amplifier supply voltage $V_{12}$. The collector of pass transistor Q2 is connected to $V_{CC}$ and its emitter is connected by conductor 35 to the anode of Schottky diode D13 and the lower plate of pump capacitor $C_H$. The upper plate of pump capacitor $C_H$ is connected by conductor 12 to the high side supply voltage terminal of driver amplifier 11 and to the cathode of Schottky diode D0, the anode of which is connected to $V_{CC}$.

Conductor 35 also is connected to the emitter of an NPN transistor Q75 and to one terminal of a current source $I_{CHH}$, the other terminal of which is connected to $V_{EE}$. The base of transistor Q75 is connected by conductor 29 to the (+) terminal of a reference voltage source V0, the (−) terminal of which is connected to $V_{EE}$. Conductor 29 also is connected to the base of clamping transistor Q67. Voltage source V0 provides a reference voltage $V_{REF\_CL}$ on conductor 29. The collector of transistor Q75 is connected by conductor 39 to one terminal of a resistor R76, the other terminal of which is connected to $V_{CC}$. A voltage $V_{MP}$, is produced on conductor 39 and is applied to the (+) input of the comparator 40 shown in subsequently described FIG. 5.

Low side class H amplifier circuitry 22B includes integrator amplifier $A_L$ having an output 27 coupled to the base of PNP pass transistor Q0. A capacitor $C_L$, sometimes referred to herein as pump capacitor $C_L$, is coupled between the emitter of pass transistor Q0 and the low side supply voltage $V_{13}$ produced on conductor 13. An integrating capacitor C1 is connected between the output 27 and (−) input of integrator amplifier $A_L$. PNP clamping transistor Q20 has its emitter coupled by a resistor to the output conductor 27 and (−) input of integrator amplifier $A_L$. The (+) input of integrator amplifier $A_L$ is coupled to $V_{MID}$ and the cathode of a Schottky diode D9, the anode of which is connected by conductor 18 to the (−) input of integrator amplifier AL, the collector of clamping transistor Q20, the collector of previously mentioned NPN current mirror output transistor Q3, and the collector of the previously mentioned PNP current mirror output transistor Q18.

The emitter of transistor Q3 in input circuit 16 is connected to $V_{EE}$ and its base is connected by conductor 24 to one terminal of a switch SW2 in input circuit 16 and to the base and collector of NPN current mirror input transistor Q4, the emitter of which is connected to $V_{EE}$. Another terminal of switch SW2 is connected by conductor 20 to the collector and base of a NPN current mirror input transistor Q43 and the base of NPN current mirror output transistor Q42 of input circuit 16, the emitter of which is connected to $V_{EE}$. The emitter of transistor Q43 also is connected to $V_{EE}$. The collector of transistor Q42 is connected by conductor 21 to the collector of previously mentioned PNP current mirror output transistor Q16, the emitter of which is connected to $V_{CC}$. In one embodiment of the invention, external pump capacitors $C_H$ and $C_L$ each have a capacitance of roughly 1 microfarad. (The emitters of the various current mirror transistors in input circuit 16 may be coupled to $V_{CC}$ or $V_{EE}$ by means of degeneration resistors.)

The output of integrator amplifier $A_L$ generates a signal $V_{AL}$ on conductor 27, which is connected to the cathode of a Schottky diode D24, and is also coupled by a resistor R1 and conductor 33 to the anode of Schottky diode D23, the anode of Schottky diode D24, and the base of PNP pass transistor Q0. Series resistor R1 limits the peak recharge current through conductor 36 so as to not produce excessive glitches in the driver amplifier supply voltage $V_{13}$. The collector of pass transistor Q0 is connected to $V_{EE}$ and its emitter is connected by conductor 36 to the cathode of Schottky diode D23 and the upper plate of pump capacitor $C_L$. The lower terminal of pump capacitor $C_L$ is connected by conductor 13 to the anode of Schottky diode D2, the cathode of which is connected to $V_{EE}$. Conductor 36 also is connected to the emitter of a PNP transistor Q27 and to one terminal of a current source $I_{CHL}$, the other terminal of which is connected to $V_{CC}$. The base of transistor Q27 is connected by conductor 30 to the base of clamping transistor Q20 and to the (−) terminal of a reference voltage source V1, the (+) terminal of which is connected to $V_{CC}$. Voltage source V1 provides a reference voltage $V_{REF\_CH}$ on conductor 30. The collector of transistor Q27 is connected by conductor 38 to one terminal of a resistor R11, the other terminal of which is connected to $V_{EE}$. A voltage $V_{MN}$ is produced on conductor 38 and applied to the (−) input of comparator 42 shown in subsequently described FIG. 5.

In input circuit 16, a current source $I_{BIAS}$ is coupled between the pole terminals of switches SW1 and SW2. The output 15 of an inverter 14 controls switches SW1 and SW2 in response to the external control signal $V_{H\_EN}$ so as to controllably connect the bias current $I_{BIAS}$ either between current mirror input transistors Q19 and Q43 (as shown in subsequently described FIG. 4A) or between current mirror input transistors Q17 and Q4 (as shown in subsequently described FIGS. 4B and 4C), so as to establish the desired ramping up or ramping down operation of integrator amplifiers $A_H$ and $A_L$. External control signal $V_{H\_EN}$ may be generated by an external processor 13.

Integrator amplifiers $A_H$ and $A_L$ in FIG. 4 may be typical high performance rail-to-rail output operational amplifiers, and they control how fast the driver amplifier supply voltages $V_{12}$ and $V_{13}$ ramp up and down. This is desirable because fast square wave signals applied to the bases of transistors Q2 and Q0 would result in a substantial amount of undesirable coupling of the fast dv/dt rate of change of the power supply voltages $V_{12}$ and $V_{13}$ into the output terminal $V_{OUT}$ of driver amplifier 11 due to its limited PSRR (power supply rejection ratio).

As shown in the timing diagram in subsequently described FIG. 6A, the magnitudes of integrator output voltages $V_{AH}$ and $V_{AL}$, and hence the magnitudes of driver amplifier supply voltages $V_{12}$ and $V_{13}$, preferably are ramped up during a "first ramping interval" and are ramped down during a "second ramping interval".

In one implementation of xDSL line driver 10, the circuit is designed so that integrator amplifier output signals $V_{AH}$ and $V_{AL}$, and hence also driver amplifier supply voltages $V_{12}$ and $V_{13}$ ramp up in magnitude approximately twice as fast as they ramp down in magnitude. It should be understood that ramping up of the magnitudes of driver amplifier supply voltages $V_{12}$ and $V_{13}$ increases the currents in current mirrors (not shown) in driver amplifier 11. However, fast ramping down of the magnitudes of driver amplifier supply voltages $V_{12}$ and $V_{13}$ decreases the currents in those current mirrors, and in fact ramping down too fast may cause the current mirrors in driver amplifier 11 to turn completely off, which could result in loss of control of driver amplifier output voltage $V_{OUT}$. Such loss of control most likely would cause the amplifier loop to open momentarily, causing the amplified signal to become distorted. This is because driver amplifier 11 has a limited power supply rejection ratio (PSRR) or common mode rejection ratio (CMRR), so when its supply voltages $V_{12}$ and $V_{13}$ start changing symmetrically (FIG. 6A), the PSRR becomes a CMRR. Both the CMRR and PSRR are important because the positive and negative supply voltages $V_{12}$ and $V_{13}$ will not be changing in a perfectly symmetrical way. The un-rejected common mode supply voltage component associated with $V_{12}$ and $V_{13}$ may cause a disturbance in the output voltage $V_{OUT}$ of driver amplifier 11. Using an asymmetric ramping up versus ramping down time of the driver amplifier supply voltages $V_{12}$ and $V_{13}$ can avoid the above mentioned problem of unintentionally turning off of the current mirrors in driver amplifier 11.

The output signal $V_{OUT}$ generated by driver amplifier 11 is affected more when the magnitudes of $V_{12}$ and $V_{13}$ are decreasing or "collapsing" (during the second ramping interval) than when they are increasing (during the first ramping interval). The result of this typically is increased distortion of the transmitted signal, which can result in increased bit error rates in the received signal. To decrease the likelihood of occurrence of such bit errors caused by driver amplifier 11, the class H circuitry 22A and 22B in the described implementation of xDSL line driver 10 ramps up the magnitudes of $V_{12}$ and $V_{13}$ over a first ramping interval equal to "t", and then ramps $V_{12}$ and $V_{13}$ down over a second ramping interval equal to 2×t. The ramping interval "t" is chosen to minimize the power supply coupling into the amplifier output. (However, if driver amplifier 11 is not more sensitive to having its supply voltages $V_{12}$ and $V_{13}$ ramped down than having them ramped up, the first and second ramping intervals may be equal.)

The first and second ramping intervals are established by the values of the integrating capacitors C0 and C1 in the integrating amplifier feedback paths and the current mirror output currents flowing through conductors 21 and 18 to the inverting inputs of integrating amplifiers $A_H$ and $A_L$, respectively. Specifically, how fast the driver amplifier supply voltages $V_{12}$ and $V_{13}$ on conductors 12 and 13 ramp up and down is controlled by the values of feedback capacitors C0 and C1 and also by the values of the currents in current mirrors Q19,Q18 and Q43,Q42 or in current mirrors Q4,Q3 and Q17, Q16, depending on the states of switches SW1 and SW2. Switches SW1 and SW2 control which pair of current mirrors Q19,Q18 and Q43,Q42 or current mirrors Q17,Q16 and Q4,Q3 are active at any particular time, and that determines the direction of ramping of driver amplifier supply voltages $V_{12}$ and $V_{13}$. In any case, integrator amplifier $A_H$ ramps up while integrator amplifier $A_L$ ramps low and vice versa as shown in FIG. 6A, so during operation $V_{AH}$ and $V_{AL}$ always are a mirror images of each other.

Figure 1:
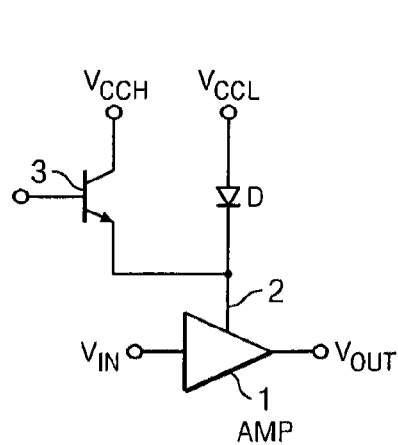
FIG. 1 is a simplified diagram of a conventional class G amplifier.
Figure 2:
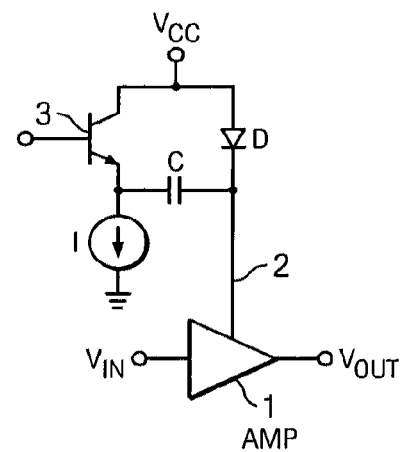
FIG. 2 is a simplified diagram of a conventional class H amplifier.
Figure 5:
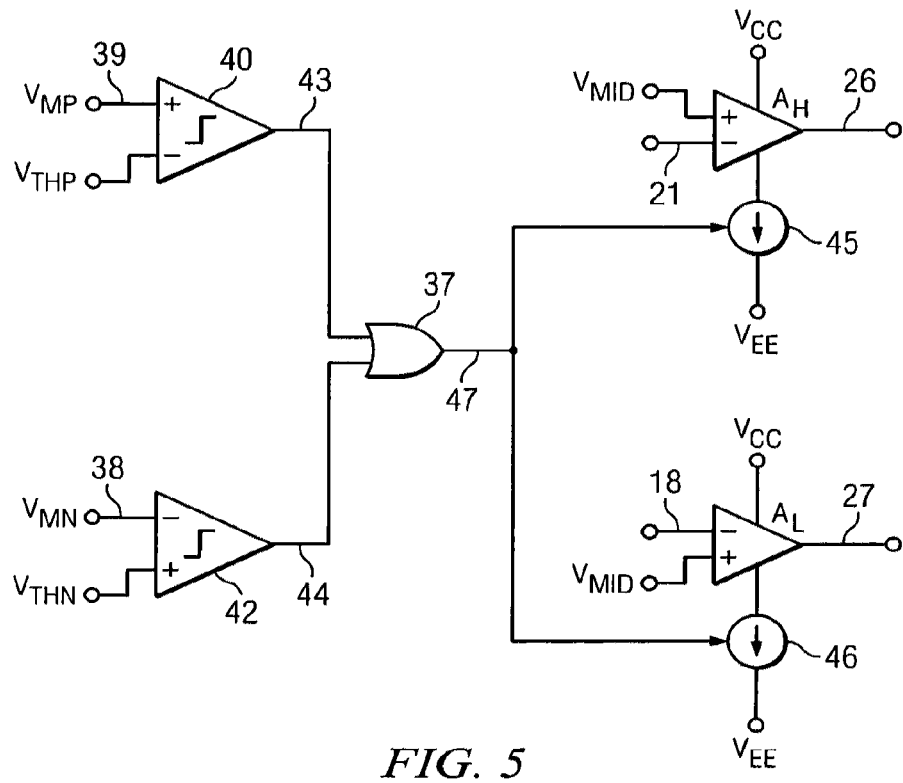
FIG. 5 is a schematic diagram of circuitry including comparators connected to conductors 38 and 39 in FIG. 4 to the control the operating power supplied to integrator amplifiers $A_H$ and $A_L$ in FIG. 4.

Referring to FIG. 5, it can be seen that the previously mentioned signal $V_{MP}$ on conductor 39 in FIG. 4 is coupled to the (+) input of a comparator 40. The output of comparator 40 is coupled by conductor 43 to one input of an OR gate 37, the output of which is connected by control conductor 47 to a voltage controlled current source 45 that determines the bias current of integrator amplifier $A_H$. Controlled current source 45 is connected between $V_{EE}$ and the low side supply voltage terminal of integrator amplifier $A_H$, and the high side supply voltage terminal of integrator amplifier $A_H$ is connected to $V_{CC}$. When $V_{MP}$ on conductor 39 exceeds the threshold voltage $V_{THP}$ on the (−) input of comparator 40, output 43 of comparator 40 is at a high level, controlled current source 45 delivers a relatively large amount current that puts integrator amplifier $A_H$ in its full power mode. When $V_{MP}$ goes below $V_{THP}$, comparator output 43 goes to a low level, causing current source 45 to switch integrator amplifier $A_H$ to its low current (and low power) mode.

Similarly, in FIG. 5 the signal $V_{MN}$ on conductor 38 in FIG. 4 is coupled to the (−) input of a comparator 42. The output 44 of comparator 42 is coupled to the other input of OR gate 37. The output 47 of OR gate 37 is also connected to the control input of a voltage controlled current source 46 that determines the bias current of integrator amplifier $A_L$. Controlled current source 46 is connected between $V_{EE}$ and the low side supply voltage terminal of integrator amplifier $A_L$. The high side supply voltage terminal of integrator amplifier $A_L$ is connected to $V_{CC}$.

When the signal $V_{MN}$ on conductor 38 exceeds the threshold voltage $V_{THN}$ on the (+) input of comparator 42, the output 44 of comparator 42 is at a high level, and current source 46 delivers a relatively large current that puts integrator amplifier $A_L$ in its full power mode. When $V_{MN}$ goes below $V_{THN}$, comparator output 44 goes to a low level, causing current source 46 to switch integrator amplifier $A_L$ to its low current, low power mode.

Thus, each of comparators 40 and 42 checks for when the associated pump capacitors $C_H$ and $C_L$ are almost fully charged and at that point drops the bias level to each of integrator amplifiers $A_H$ and $A_L$. This is a power saving feature that only occurs following the second ramping interval after the pump capacitors $C_H$ and $C_L$ are recharged. Note also that since the outputs of comparators 40 and 42 are ORed together, both of pump capacitors $C_H$ and $C_L$ need to be almost fully charged before the integrator amplifier bias levels actually is decreased.

When pump capacitors $C_H$ and $C_L$ are fully "recharged" as subsequently described with reference to FIGS. 6A and 4C, currents $I_{CHH}$ and $I_{CHL}$ are shunted into transistors Q27 and Q75 and away from capacitors $C_H$ and $C_L$. As currents $I_{CHH}$ and $I_{CHL}$ are shunted away from pump capacitors $C_H$ and $C_L$ and through resistors R76 and R11, respectively, the voltages $V_{MP}$ and $V_{MN}$ developed by those currents across resistors R11 and R76, respectively, are monitored and compared to the threshold voltages $V_{THP}$ and $V_{THN}$, respectively, by means of comparators 40 and 42 shown in FIG. 5. Comparators 40 and 42 switch states when those thresholds are crossed by $V_{MP}$ and $V_{MN}$ on conductors 39 and 38, respectively. This decreases the currents in current sources 45 and 46 in FIG. 5, which provide bias to integrator amplifiers $A_H$ and $A_L$.

Figure 4A:
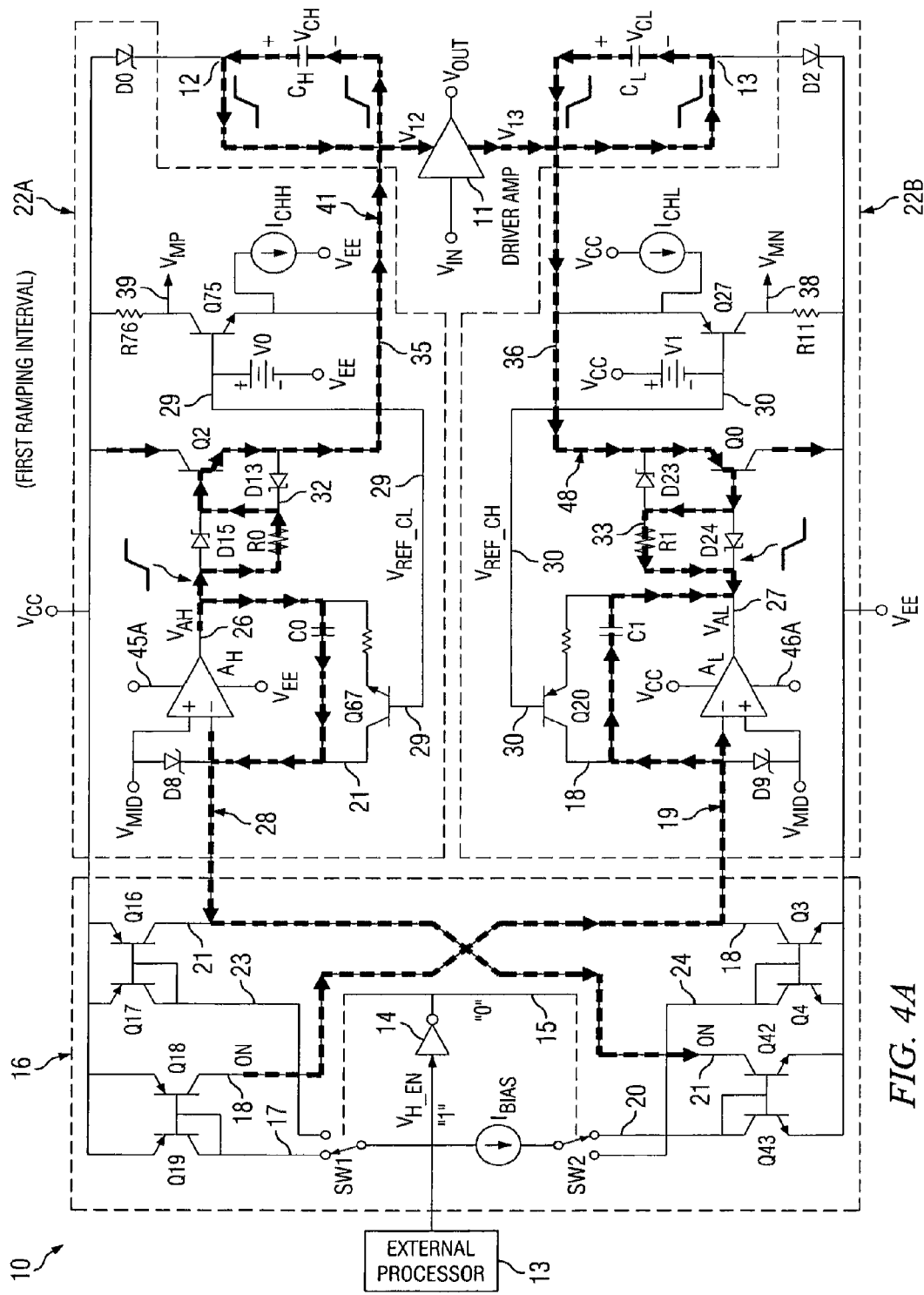
FIG. 4A is a copy of FIG. 4 further indicating various signal paths that illustrate circuit operation during a first ramping interval.
Figure 4B:
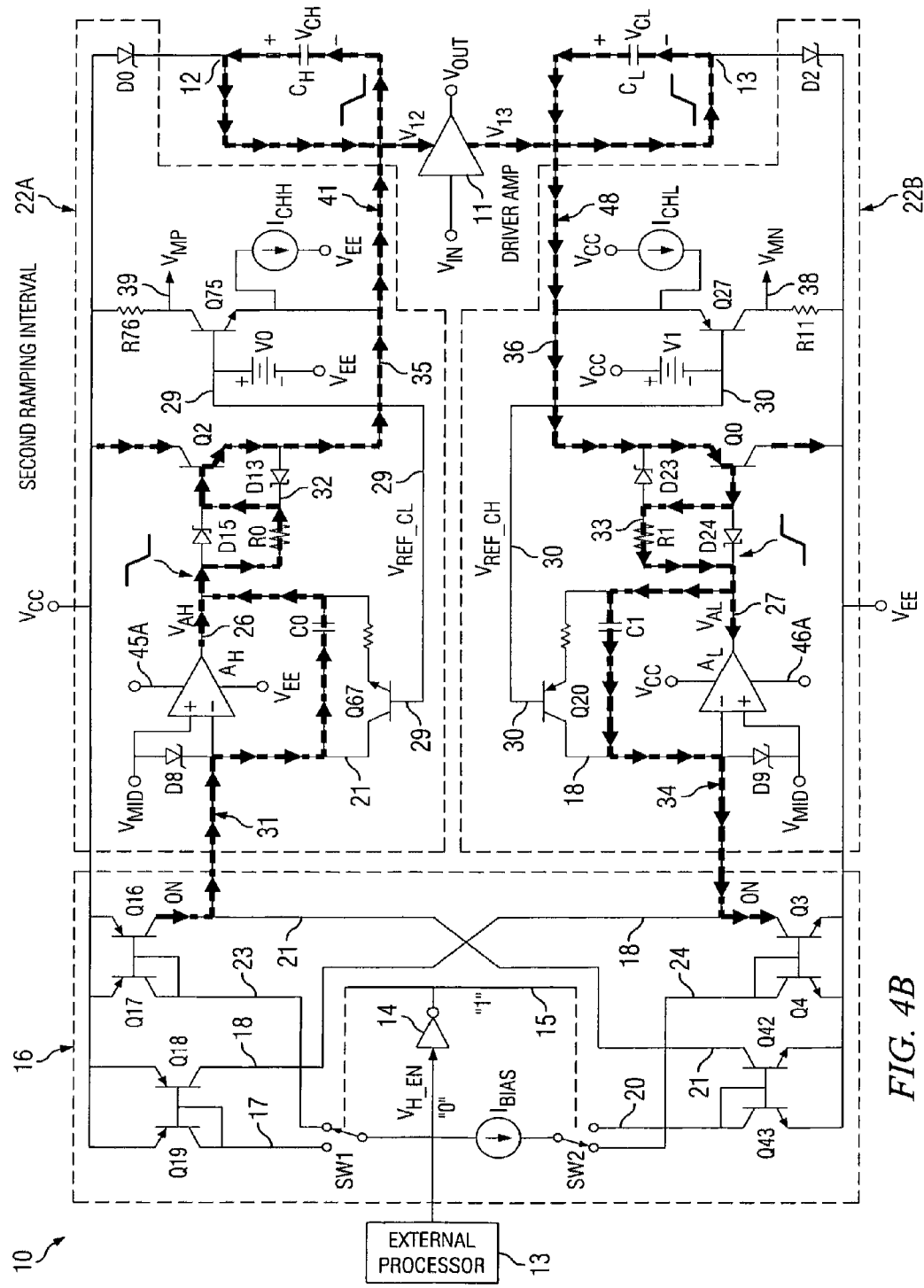
FIG. 4B is a copy of FIG. 4 further indicating various signal paths that illustrate circuit operation during a second ramping interval.

Next, the operation of class H xDSL line driver 10 of FIG. 4 is described with reference to FIGS. 4A, 4B, 4C and 6A. FIG. 6A shows the waveforms of $V_{H\_EN}$, $V_{AH}$, $V_{AL}$, $V_{12}$, and $V_{13}$ during the previously mentioned "first ramping interval" and "second ramping interval". FIG. 4A shows signal paths through class H xDSL line driver 10 during the first ramping interval, FIG. 4B shows signal paths through class H xDSL line driver 10 during the second ramping interval, and FIG. 4C shows the signal path through the class H xDSL line driver 10 following the second ramping interval when integrator amplifiers $A_H$ and $A_L$. are providing charge to capacitors $C_H$ and $C_L$. (Note that the ramp up and ramp down technique is provided primarily to limit the previously mentioned signal distorting coupling from the supply voltage changes of $V_{12}$ and $V_{13}$ of the driver amplifier 11 into its output voltage $V_{OUT}$.)

Operation During the First Ramping Interval

Figure 6A:
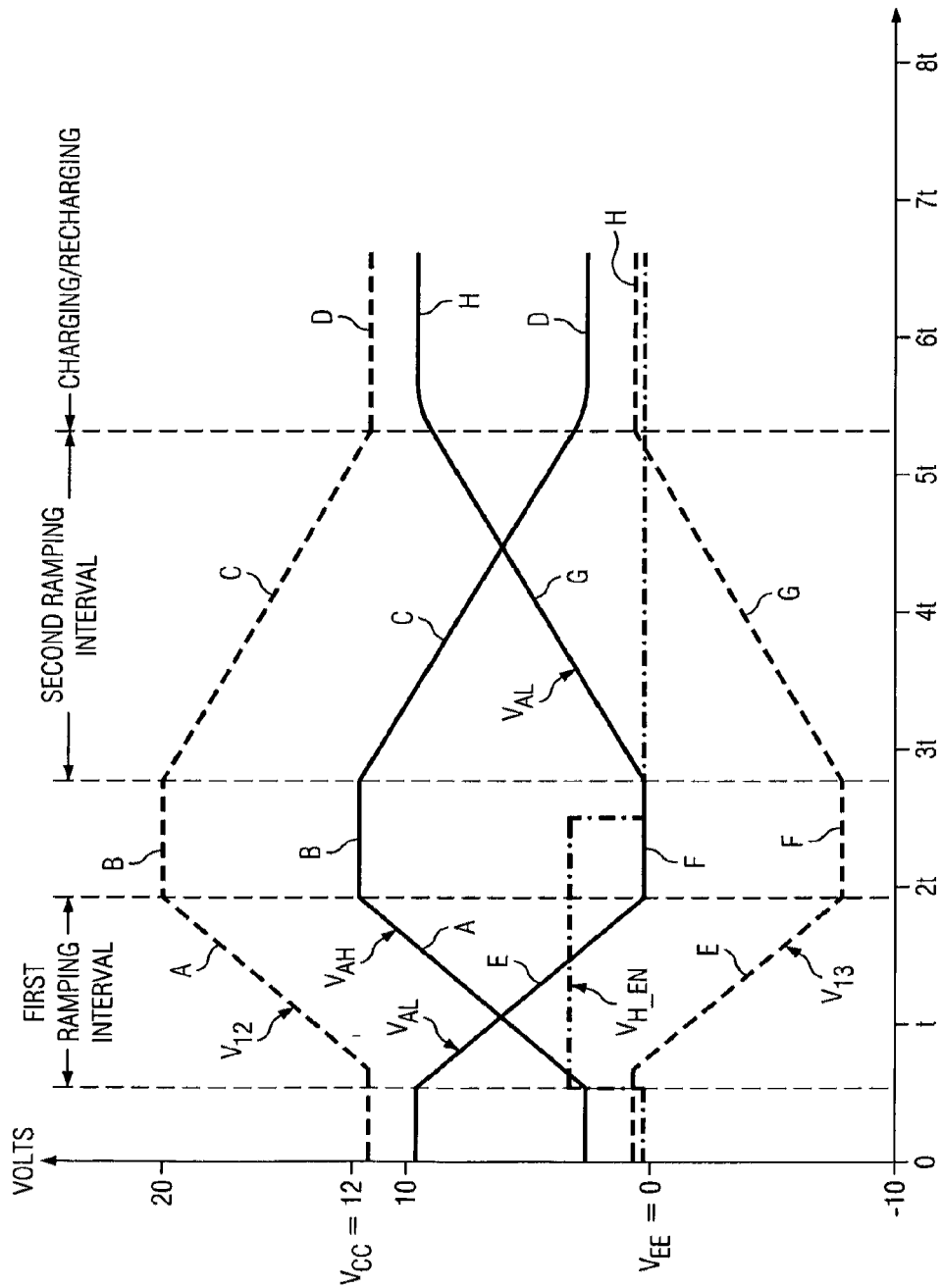
FIG. 6A is a timing diagram showing the line driver supply voltage signals $V_{12}$ and $V_{13}$ in FIG. 4.

Referring to FIG. 6A, it is assumed that pump capacitors $C_H$ and $C_L$ are fully "recharged" at the beginning of the first ramping interval. At the beginning of the first ramping interval, external processor 13 sets control signal $V_{H\_EN}$ to a "1" level, which causes inverter 14 to produce a "0" level on the control terminals of switches SW1 and SW2, thereby connecting the current source $I_{BIAS}$ between conductors 17 and 20, as shown in FIG. 4A. The resulting current $I_{BIAS}$ in conductor 17 causes current mirror Q19,Q18 to produce a current in conductor 18 along the signal path indicated by dashed line 19 in FIG. 4A. The resulting current $I_{BIAS}$ in conductor 20 causes current mirror Q43,Q42 to produce a current in conductor 21 along the signal path indicated by dashed line 28.

The currents along signal paths 28 and 19 in FIG. 4A start the first ramping interval by causing integrator amplifier output signal $V_{AH}$ to begin ramping up along segment A in FIG. 6A, and by causing integrator amplifier output signal $V_{AL}$ to begin ramping down along segment E in FIG. 6A, as shown in FIG. 6A. The $V_{AH}$ waveform rises as indicated by segment A thereof, and the signal path 41 in FIG. 4A indicates that the base current to NPN pass transistor Q2 is provided via resistor R0, and turns on emitter follower pass transistor Q2. Consequently, the voltage on conductor 35 follows $V_{AH}$, and pump capacitor $C_H$ boosts the level of $V_{12}$ by the amount of the voltage stored across pump capacitor $C_H$ (less the voltage drop across pass transistor Q2) from approximately the low voltage level ($V_{CC}-V_{D0}$) of $V_{AH}$ to its high voltage level indicated by segment B of the $V_{12}$ waveform. Schottky diode D15 is only forward biased in cases wherein the voltage drop across resistor R0 becomes large enough to turn it on, which may happen if the current gain β of pass transistor Q2 is low and the sheet resistance of resistor R0 is high.

Similarly, the $V_{AL}$ waveform falls as indicated by segment E thereof, and the signal path 48 in FIG. 4A and turns on PNP emitter follower pass transistor Q0. Consequently, the voltage on conductor 36 follows $V_{AL}$, and pump capacitor $C_L$ boosts the voltage of $V_{13}$ by the amount of the voltage stored across pump capacitor $C_L$ (less the voltage drop across pass transistor Q0) down from its high level ($V_{EE}+V_{D2}$) to the low level indicated by segment F of the $V_{13}$ waveform in FIG. 6A. Schottky diode D24 is only forward biased in cases wherein the voltage drop across resistor R1 becomes large enough to turn it on, which may happen if the current gain β of pass transistor Q0 is low and the sheet resistance of resistor R1 is high. (Decay of the voltage across the integrator capacitors C0 and C1 due to IR drops in resistors R0 and R1 and the increased base-emitter voltages of pass transistors Q0 and Q2 as the current therein reach maximum values is relatively small and not observable on the B and F segments of the waveforms shown in FIG. 6A.)

Thus, as the high magnitude values of driver amplifier supply voltages $V_{12}$ and $V_{13}$ are "asserted" during the first ramping interval, with pump capacitors $C_H$ and $C_L$ initially in a fully charged or "recharged" condition, $C_H$ and $C_L$ are partially discharged into driver amplifier supply conductors 12 and 13, respectively, thereby boosting supply voltages $V_{12}$ and $V_{13}$ and thereby allowing driver amplifier 11 to accurately amplify the previously mentioned signal peaks P contained in the DMT input signal V. (When $V_{12}$ and $V_{13}$ are "asserted" as indicated along segments A,B,C and E,F,G of FIG. 6A, integrator amplifiers $A_H$ and $A_L$ are said to be operating in class H mode, and when $V_{12}$ and $V_{13}$ are along segments D and H, i.e., not "asserted", they are said to be in class A/B mode.)

The currents in the collectors of transistors Q27 and Q75 are used to determine the values of $V_{MP}$ and $V_{MN}$ which are applied to the (+) and (−) inputs of comparators 40 and 42, respectively, in FIG. 5. The outputs of comparators 40 and 42 are used to reduce the amount of power dissipated in integrator amplifiers $A_H$ and $A_L$ to about 25% of its maximum level since they do not need to be fully powered when they are not charging pump capacitors $C_H$ and $C_L$ or driving the bases of pass transistors Q2 and Q0.

When terminals 35 and 36 of pump capacitors $C_H$ and $C_L$ are ramped up so as to boost $V_{12}$ and $V_{13}$ up and down, respectively, during the fast first ramping interval "t", the entire current being delivered by driver amplifier 11 to a load (not shown) flows in pass transistor Q2 and pass transistor Q0, so those pass transistors must be scaled substantially equally with the output transistors in driver amplifier 11. Note that when the pumped supply voltages are not asserted (class A/B mode), the load current delivered by driver amplifier 11 is passed through diodes D0 and D2, which should be scaled so as to accommodate the full load current.)

When sufficient time has elapsed after end of the first ramping interval to allow driver amplifier 11 to perform the needed accurate amplification of the present signal peak P (FIG. 3) of $V_{IN}$, external processor 13 generates a "0" level of control signal $V_{H\_EN}$ in order to initiate the beginning of the second ramping interval, as shown in FIG. 6A.

Operation During and Following the Second Ramping Interval

Note that during the second ramping interval, signal paths 41 and 48 shown in FIG. 4B are the same as those for the first ramping interval shown in FIG. 4A. This is true until such time that diodes D0 and D2 become forward biased and recharging of pump capacitors $C_H$ and $C_L$ can begin.

The second ramping interval simply returns the driver amplifiers to class A/B mode operation in such a way as to minimize the undesirable signal-distorting coupling mentioned earlier. Depending on how discharged pump capacitors $C_H$ and $C_L$ became during processing of the signal peak event, recharging of pump capacitors $C_H$ and $C_L$ will begin at some point during the second ramping interval. However, most of the pump capacitor recharging occurs after the second ramping interval has been completed. As the outputs of integrator amplifiers $A_H$ and $A_L$ ramp toward their clamped states determined by reference voltages V0 and V1, the magnitude of supply voltages $V_{12}$ and $V_{13}$ will decrease to the point that diodes D0 and D2 will again become forward biased. At that point, the driver amplifier will have resumed class A/B operation and diodes D0 and D2 will maintain $V_{12}$ and $V_{13}$ at $V_{CC}-V_{D0}$ and $V_{EE}+V_{D2}$, respectively. After this has occurred, the outputs $V_{AH}$ and $V_{AL}$ of integrator amplifiers $A_H$ and $A_L$ will continue to ramp toward their clamped states and diodes D13 and D23 will become forward biased. This allows integrator amplifier $A_H$ to recharge pump capacitor $C_H$ through the circuit path including diode D0, diode D13, and resistor R0. Similarly, this also allows integrator amplifier $A_L$ to recharge pump capacitor $C_L$ through the circuit path including diode D2, diode D23, and resistor R1.

It should be noted that the $C_H$ and $C_L$ capacitor recharging path from the output of integrator amplifier $A_H$ is through resistor R0 and diode D13 (and similarly for integrator amplifier $A_L$). This is essentially an RC circuit, so the amount of charge placed on the pump capacitor $C_H$ is exponentially proportional to the voltage across resistor R0, so during the last approximately 12% of the charging cycle very little recharging current flows out of integrator amplifiers $A_H$ and $A_L$. Therefore, for the last approximately 12% of the recharging cycle the recharging currents are provided by current sources $I_{CHH}$ and $I_{CHL}$, which can be fixed or variable depending on the rate at which it is necessary to complete the recharging of the pump capacitors.

During the second ramping interval, driver amplifier supply voltage $V_{12}$ is ramped down, and low side driver amplifier supply voltage $V_{13}$ is simultaneously ramped up. Pump capacitors $C_H$ and $C_L$ should be recharged as quickly as possible following the second ramping interval. Schottky diode D13 in the upper class H circuitry 22A and Schottky diode D23 in lower class H circuitry 22B are used to accomplish the recharging of $C_H$ and $C_L$, respectively. Schottky diode D15 becomes reverse biased and Schottky diode D13 becomes forward biased as the emitter-base junction of pass transistor Q2 becomes reverse biased, and pump capacitor $C_H$ is recharged through the path including resistor R0 and Schottky diode D13 as $V_{AH}$ falls back to its lowest level. Similarly, Schottky diode D24 becomes reverse biased and Schottky diode D23 becomes forward biased as the emitter-base junction of pass transistor Q0 becomes reverse biased, and pump capacitor $C_L$ is recharged through the path including resistor R1 and Schottky diode D23 as $V_{AL}$ rises back to its highest level.

Figure 4C:
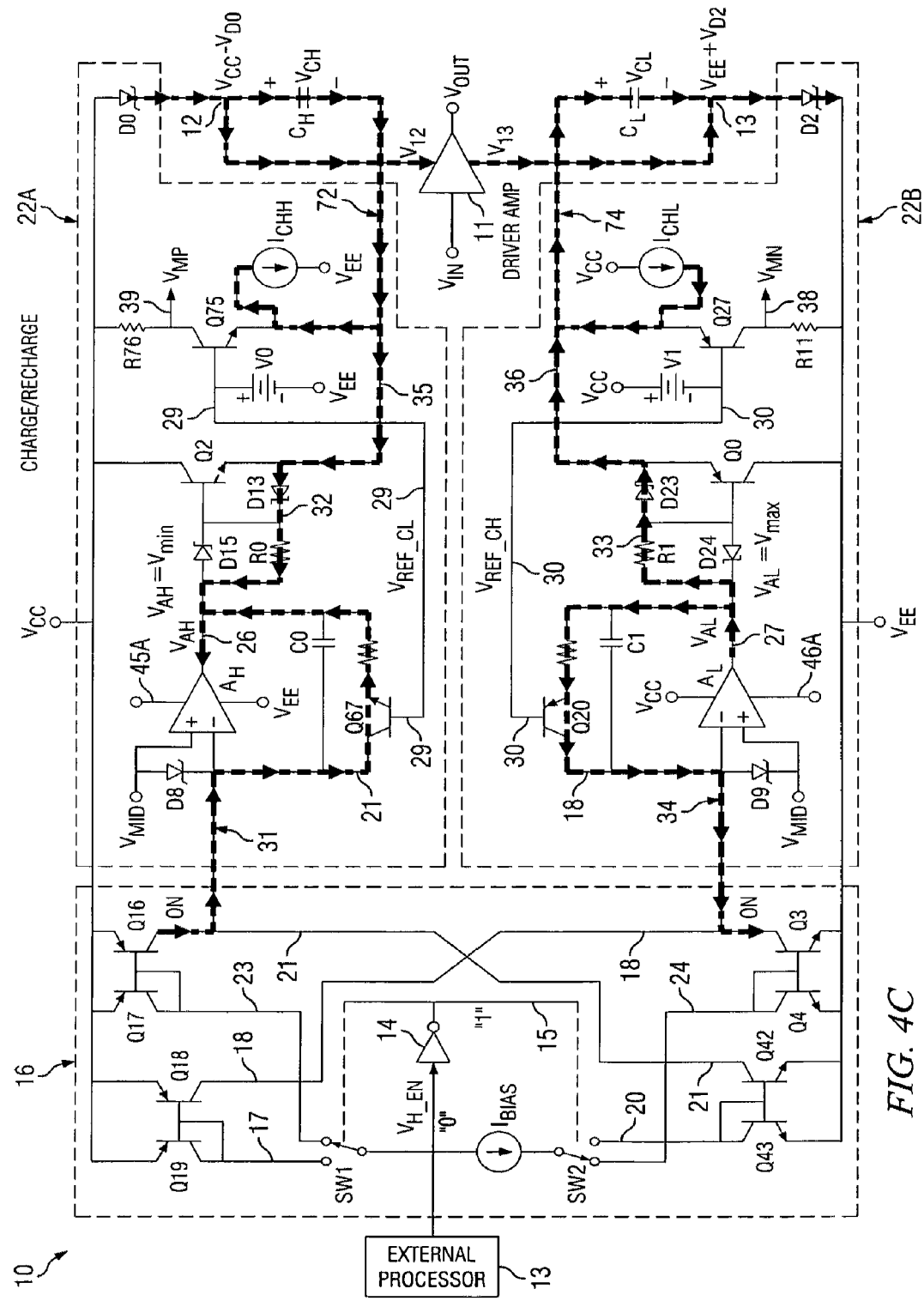
FIG. 4C is a copy of FIG. 4 further indicating signal paths that illustrate charge/recharge operation following the second ramping interval.

Referring to FIGS. 4B, 4C, and 6A, when external processor 13 sets control signal $V_{H\_EN}$ to a "0" level, that causes inverter 14 to produce a "1" level on the control terminals of switches SW1 and SW2, thereby connecting the current source $I_{BIAS}$ between conductors 23 and 24, as shown in FIG. 4B. The resulting current $I_{BIAS}$ in conductor 24 causes current mirror Q17,Q16 to produce a current in conductor 21 along the signal path indicated by dashed line 31. The resulting current $I_{BIAS}$ in conductor 24 causes current mirror Q4,Q3 to produce a current in conductor 18 along the signal path indicated by dashed line 34 in FIG. 4B.

The currents along signal paths 31 and 34 in FIG. 4B start the second ramping interval by causing the integrator amplifier output waveform $V_{AH}$ in FIG. 6A to begin ramping down along segment C thereof and by causing integrator amplifier output signal $V_{AL}$ to begin ramping up along segment G thereof. As the $V_{AH}$ waveform falls as indicated by segment C, and after $V_{12}$ falls to the voltage $V_{CC}-V_{D0}$ maintained on conductor 12 by diode D0, the signal path 72 in FIG. 4C forward biases diode D13, and the integrator amplifier $A_H$ begins "recharging" the partially discharged pump capacitor $C_H$ by drawing current from the bottom plate of $C_H$ through diode D13, resistor R0, and conductor 35. Integrator amplifier $A_H$ continues to ramp the $V_{AH}$ waveform down to the level indicated by segment D, and then continues to recharge pump capacitor $C_H$ until it is nearly fully recharged. Then a second stage of recharging of $C_H$ takes over to complete the recharging of $C_H$, as subsequently described.

Similarly, as integrator amplifier $A_L$ ramps up, $V_{AL}$ rises as indicated by segment G thereof, and after $V_{13}$ rises to the voltage level $V_{EE}+V_{D2}$ maintained on conductor 13 by diode D2, the signal path 74 in FIG. 4C forward biases diode D23 and integrator amplifier $A_L$ begins the first mode of "recharging" the partially discharged pump capacitor $C_L$ by delivering current to the top plate of $C_L$ through diode D23, resistor R1, and conductor 36. Integrator amplifier $A_L$ continues to ramp $V_{AL}$ up to the level indicated by segment H thereof, and then continues to recharge pump capacitor $C_L$ until it is nearly fully recharged. Then the above mentioned second stage of recharging takes over to complete the recharging of $C_L$, as subsequently described.

The ramp down is slower than the ramp up because the driver amplifier is more sensitive to having its supplies ramped down than up. During normal operation, recharging of pump capacitors $C_H$ and $C_L$ will not begin until the second ramping interval has been nearly completed because pump capacitors $C_H$ and $C_L$ will not be substantially discharged. In most cases pump capacitors $C_H$ and $C_L$ will continue to discharge during the second ramping interval until ramping has progressed far enough to allow diodes D0 and D2 to become forward biased. The charging path for pump capacitors $C_H$ and $C_L$ is through diodes D0 and D2, respectively, so these diodes must be forward biased before recharging can take place. At that point driver amplifier 11 is no longer being supplied by pump capacitors $C_H$ and $C_L$ but by $V_{CC}$ through diode D0 and by $V_{EE}$ through diode D2. Therefore, most of the recharging takes place following the second ramping interval. Note also that recharging can occur from the outputs of the integrator amplifiers and $A_H$ and $A_L$ and the current sources $I_{CHH}$ and $I_{CHL}$, simultaneously, but for the last 12% or so the recharging from current sources $I_{CHH}$ and $I_{CHL}$ becomes dominant.

Thus, there are two mechanisms which "recharge" pump capacitors $C_H$ and $C_L$ following the second ramping interval. After pump capacitors $C_H$ and $C_L$ are partially discharged into driver amplifier supply voltage terminals 12 and 13 to boost $V_{12}$ and $V_{13}$ during the ramping interval. Following the ramping intervals, pump capacitors $C_H$ and $C_L$ are recharged by integrator amplifiers $A_H$ and $A_L$ and by current sources $I_{CHH}$ and $I_{CHL}$. However, the recharging of the pump capacitors $C_H$ and $C_L$ by integrator amplifiers $A_H$ and $A_L$ is a diminishing exponential charging, which means that as pump capacitors $C_H$ and $C_L$ continue to be recharged, less and less current is supplied to them by integrator amplifiers $A_H$ and $A_L$.

Accordingly, current sources $I_{CHH}$ and $I_{CHL}$ become the dominant charging mechanisms as the voltages across pump capacitors $C_H$ and $C_L$ approach their maximum potentials. Reference voltages V1 and V0, which are connected by conductors 30 and 29 to the bases of transistors Q75 and Q27, respectively, determine the values of the voltages on conductors 35 and 36, respectively, at which pump capacitors $C_H$ and $C_L$ have become fully recharged. ($I_{CHH}$ and $I_{CHL}$ may be fixed or variable, depending on how fast pump capacitors $C_H$ and $C_L$ need to be fully charged. For example, $I_{CHH}$ and $I_{CHL}$ may be switched to a high current mode if the last few of volts to be charged need to be faster and then switched back to a low current mode when the caps become fully charged.)

Figure 6B:
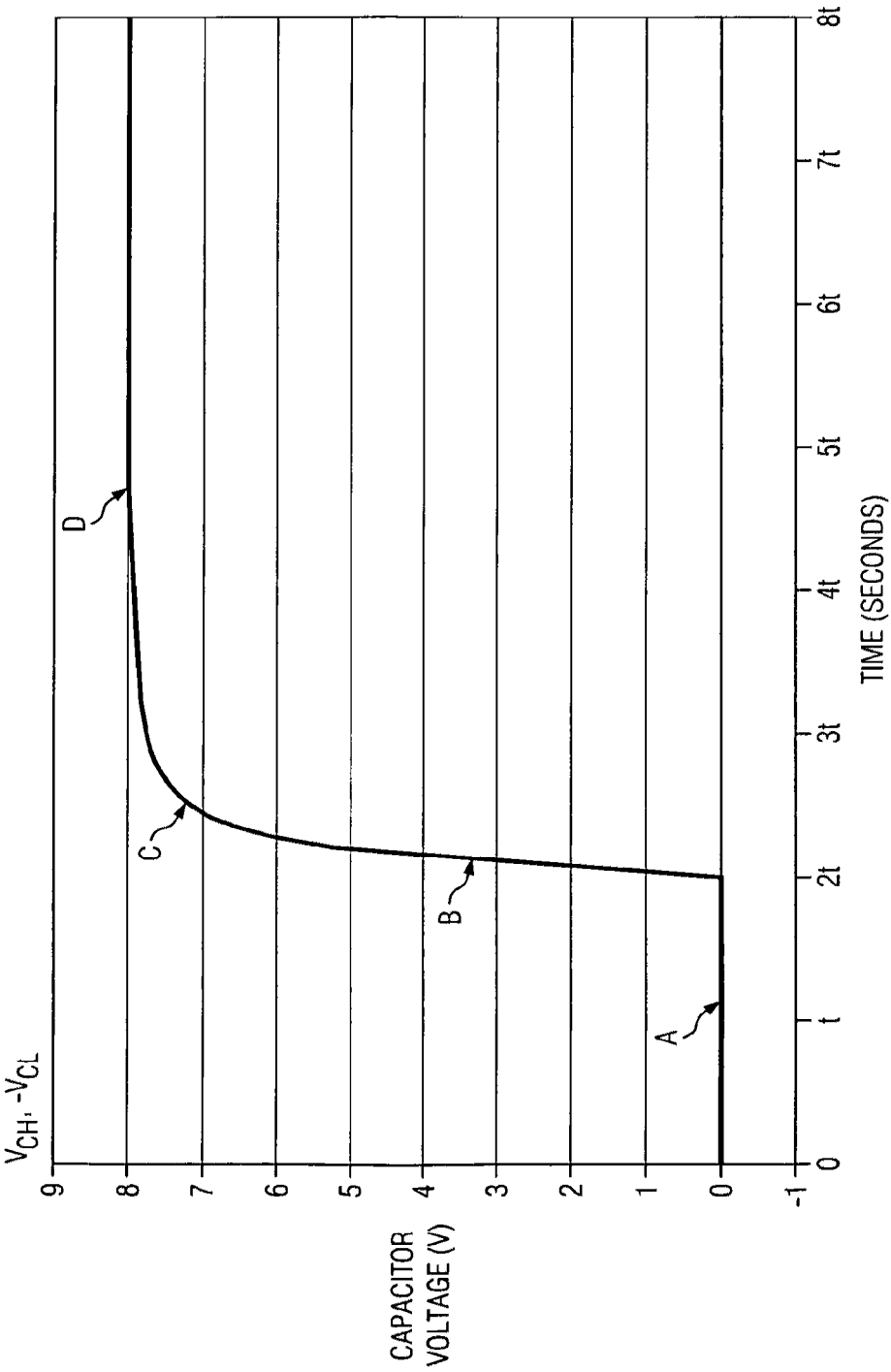
FIG. 6B is a diagram illustrating the voltages across the capacitors $C_H$ and $C_L$ in FIG. 4 beginning from a fully discharged condition and ending in a fully charged state.

The curve in FIG. 6B indicates the voltage $V_{CH}$ developed across pump capacitor $C_H$ while it is being recharged. In this case, the recharging cycle is shown for capacitor $C_H$ starting from a fully discharged state (the A segment of the curve shown in FIG. 6B). Along the B segment of the curve shown in FIG. 6B from 0 volts to about 88% charged (just over 7 volts in this case) the charge to pump capacitor $C_H$ is predominantly being supplied by integrator amplifier $V_{AH}$ through resistor R0 and diode D13. During the last 12% of the charge cycle (the segment of the curve between point C and D of the curve shown in FIG. 6B), the charge is mainly being provided by current source $I_{CHH}$. As can be seen on the curve shown in FIG. 6B, the last 12% of the recharging cycle is much slower than the first 88%. If necessary, current source $I_{CHH}$ can be made variable; that is, it can switch to a higher output state until pump capacitor $C_H$ is fully charged and then switched to a low "trickle charge" mode the keep pump capacitor $C_H$ fully charged. In this way the last 12% of the recharging cycle can be made to happen more quickly. The curve in FIG. 6B is also applicable to the recharging of pump capacitor $C_L$ by integrator amplifier $V_{AL}$ and current source $I_{CHL}$.

The curve in FIG. 6B indicates the voltage developed across pump capacitors $C_H$ and $C_L$ as they are being charged from a fully discharged state. During normal operation of the class H amplifier, capacitors $C_H$ and $C_L$ will only be discharged on the order of a volt or two following processing of a maximum peak event or a series of peak events. As such, the recharge cycle will only include the portion of the curve shown in FIG. 6B along the B segment of the curve from about 6 volts to point D of the curve wherein pump capacitors $C_H$ and $C_L$ become fully charged. Segment B of the curve shown in FIG. 6B is generated primarily by integrator amplifier $V_{AH}$ or integrator amplifier $V_{AL}$ during the first recharging mode. The segment of the curve between points C and D of the curves are generated mainly by current source $I_{CHH}$ or $I_{CHL}$, during the second recharging mode.

As the voltages $V_{CH}$ and $V_{CL}$ across pump capacitors $C_H$ and $C_L$, respectively, approach their fully recharged values, the second charging mechanism by means of current sources $_{ICHL}$ and $I_{CHH}$ becomes dominant, wherein diodes D13 and D23 begin to become reverse biased but pump capacitors $C_H$ and $C_L$ continue to be recharged by suitable amounts of current from current sources $I_{CHH}$ and $_{ICHL}$, respectively. These two current sources continue to supply charge to pump capacitors $C_H$ and $C_L$ until the currents are shunted away into the emitters of transistors Q27 and Q75, which are connected to conductors 35 and 36. At this point the charging process is complete and both of pump capacitors $C_H$ and $C_L$ are recharged to a suitable voltage. When pump capacitors $C_H$ and $C_L$ are fully recharged, pass transistors Q2 and Q0 are turned off and do not conduct more than a few microamperes.

When integrator amplifiers $A_H$ and $A_L$ have returned to their minimum and maximum values, respectively, the feedback paths of integrator amplifiers $A_H$ and $A_L$ are controlled by clamping transistors Q67 and Q20, the bases of which are coupled to reference voltages $V_{REF\_CL}$ and $V_{REF\_CH}$. Clamping transistors Q67 and Q20 operate to limit the high and low excursions of $V_{AH}$ and $V_{AL}$, respectively. The voltages $V_{REF\_CL}$ and $V_{REF\_CH}$ on conductors 30 and 29, respectively, set the maximum magnitude voltages to which the upper plate of pump capacitor $C_H$ and the lower plate of pump capacitor $C_L$, respectively, are recharged following the second ramping interval. The clamping in the feedback paths including transistors Q67 and Q20 prevents the outputs of integrator amplifiers $A_H$ and $A_L$ from going all the way to the supply voltage rails $V_{EE}$ and $V_{CC}$, respectively, by clamping $A_H$ and $A_L$ such that pass transistors Q2 and Q0, respectively, are just barely turned off. (If the clamps were not present the outputs of $A_H$ and $A_L$ would go approximately to the $V_{CC}$ and $V_{EE}$ supply voltage rails, respectively.) In FIG. 6A it can be seen that a delay occurs between $V_{H\_EN}$ and the time at which $A_{12}$ and $A_{13}$ begin to ramp. This delay is proportional the voltage change that must occur at the outputs of $A_H$ and $A_L$ before transistors Q2 and Q0 turn back on. If the feedback path clamps transistors were not present, this delay would be excessive.

When the output $V_{AH}$ of integrator amplifier $A_H$ is ramped down as indicated by segment C in FIG. 6A, all the way to its lowest level D, and the output $V_{AL}$ of integrator amplifier $A_L$ has ramped up, as indicated by segment G, all the way to its highest level, the feedback paths around each of integrator amplifiers $A_H$ and $A_L$ are clamped by clamping transistors Q67 and Q20, respectively, so as to close the feedback loops across integrating capacitors C0 and C1. Otherwise, $V_{AH}$ would go nearly all the way to the lower rail voltage $V_{EE}$ and $V_{AL}$ would go nearly all the way to the higher rail voltage $V_{CC}$. If that were to happen, limiting voltages at which pump capacitor $C_H$ begins to boost driver amplifier supply voltage $V_{12}$ above integrator output voltage $V_{AH}$ and pump capacitor $C_L$ begins to boost driver amplifier supply voltage $V_{13}$ below integrator amplifier output voltage $V_{AL}$ will be significantly below or above the corresponding integrator amplifier output voltages.

Also, the limiting lowest voltage of $V_{AH}$ referred to above would be well below the base voltage at which pass transistor Q2 needs to be turned on. That would cause a large delay as the output voltage $V_{AH}$ or $V_{AL}$ of the corresponding integrator amplifier $A_H$ or $A_L$ increases before it starts raising the base voltage of pass transistor Q2 or lowering the base voltage of the other pass transistor Q0. The circuitry including clamping transistors Q67 and Q20 clamps the corresponding limiting voltages to points just below or above the points at which pass transistors Q2 and Q0 turn off to minimize the delay before the driver amplifier supply voltage $V_{12}$ starts to rise and the delay before driver amplifier supply voltage $V_{13}$ starts to fall.

Figure 3:
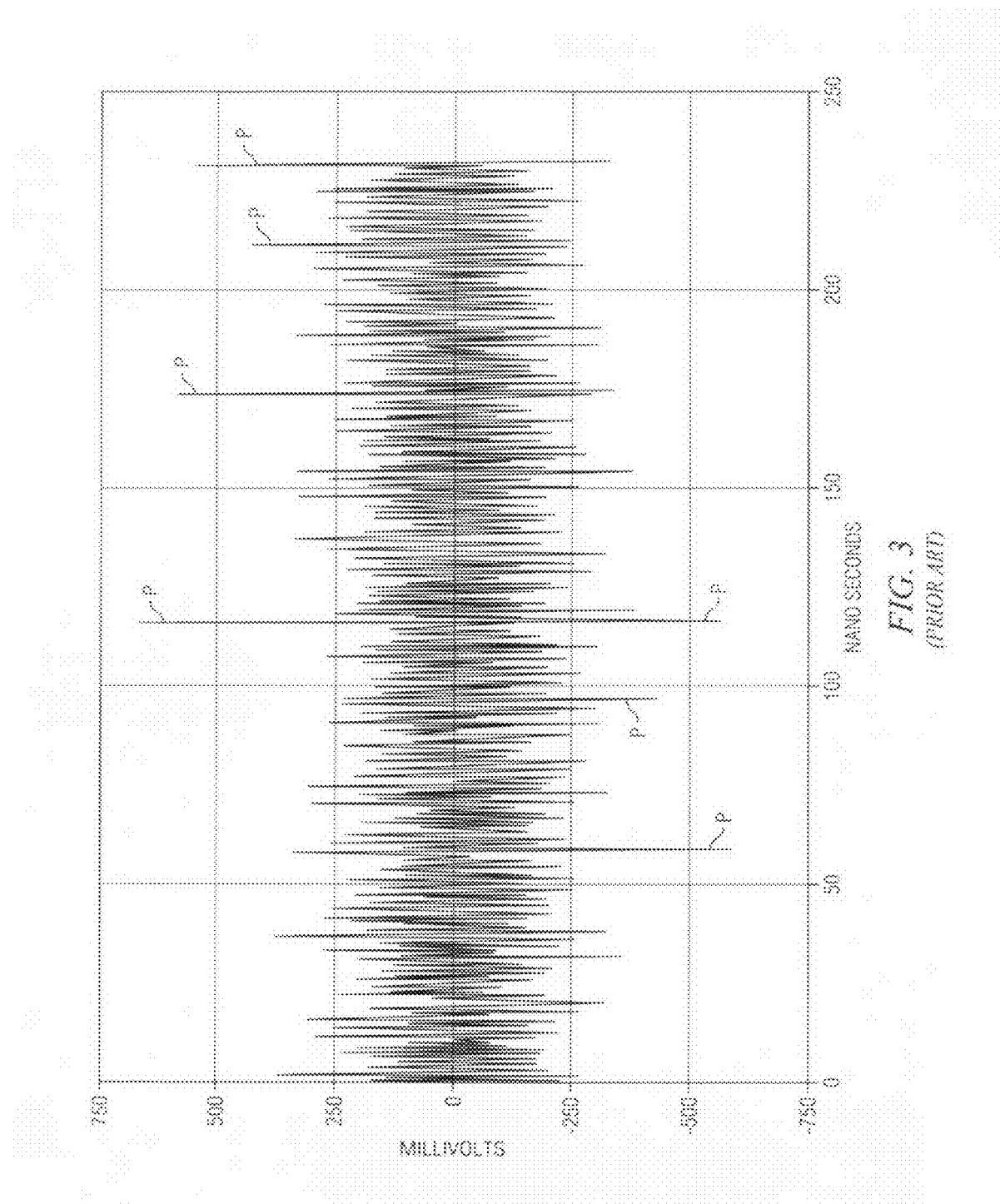
FIG. 3 is a diagram of a typical VDSL DMT signal.

When it is necessary to process a signal peak of a DMT signal (e.g., as shown in FIG. 3), $V_{H\_EN}$ may be asserted by processor 13 to initiate the first ramping interval at a time sufficiently prior to when the signal peak is to arrive at the input of driver amplifier 11, so boosted levels of $V_{12}$ and $V_{13}$ are powering driver amplifier 11 by the time the signal peak P (FIG. 3) arrives at the input of driver amplifier 11.

Thus, the invention provides a class H line driver topology with controlled up and down ramping of high magnitude driver amplifier supply voltage levels, wherein integrator amplifiers are used both to control the ramping rates and to recharge the pump capacitors. The gated topology of the class H amplifiers can be utilized such as external processor 13 in FIG. 4, which generates the signal $V_{H\_EN}$ to request xDSL line driver 10 to switch to the high magnitude supply voltage levels of $V_{12}$ and $V_{13}$ when a peak amplitude input signal is imminent at the $V_{IN}$ input of the driver amplifier 11. The desired operation is achieved at lower power levels than is the case for non-gated amplifier topologies in which the supply voltage levels are increased directly in response to the signal $V_{IN}$ to be amplified. Furthermore, other higher performance characteristics may be achieved because the supply voltages ramp up slower than they would in the case wherein they respond to the signal itself, because fast-changing supply voltages tend to distort the signal because of limited PSRR and/or CMRR of the driver amplifier.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. Amplifier circuitry powered by a first supply voltage and a second supply voltage, comprising:
   (a) a driver amplifier for amplifying an input signal to generate an output signal, the driver amplifier having a first supply terminal for conducting a first driver amplifier supply voltage and a second supply terminal for conducting a second driver amplifier supply voltage;
   (b) first amplifier circuitry including
      1) a first integrator amplifier and associated first integrating capacitor for producing a first output signal, and
      2) a first pass transistor having a control electrode coupled to the first output signal;
   (c) a first pump capacitor having a first terminal coupled to the first supply terminal and the first supply voltage and a second terminal coupled to a first electrode of the first pass transistor; and
   (d) input circuitry for both controlling a direction of ramping of the first integrator amplifier during a first ramping interval to produce increased amplitude of the first driver amplifier supply voltage and controlling a direction of ramping of the first integrator amplifier during a second ramping interval to produce re-charging of the first pump capacitor in response to a control signal, the input circuitry including switching circuitry having an input coupled to receive the control signal, first current source circuitry having an input coupled to the switching circuitry and an output coupled to a first input of the first integrator amplifier, and second current source circuitry having an input coupled to the switching circuitry and an output coupled to the first input of the first integrator amplifier.

2. The amplifier circuitry of claim 1 wherein the first pass transistor is an NPN transistor having a base coupled to the first output signal, a collector coupled to the first supply voltage, and an emitter coupled the second terminal of the first pump capacitor, the first amplifier circuitry further including a first pump capacitor recharging path including a first diode having an anode coupled to the second terminal of the first pump capacitor and a cathode coupled to the first output signal by a first resistor, and wherein the first terminal of the first pump capacitor is coupled to the cathode of a second diode having an anode coupled to the first supply voltage.

3. The amplifier circuitry of claim 1 wherein the first integrating capacitor is coupled between an output of the first integrating amplifier and the first input of the first integrator amplifier, the amplifier circuitry including a first clamping transistor having a control electrode coupled to a first reference voltage, a first electrode coupled to the first input of the first integrator amplifier, and a second electrode coupled to the output of the first integrating amplifier.

4. The amplifier circuitry of claim 3 wherein the first clamping transistor is an NPN transistor having an emitter coupled to the output of the first integrator amplifier, a collector coupled to the first input of the first integrator amplifier, and a base coupled to the first reference voltage, and wherein the first reference voltage has a value slightly below a voltage at which the first pass transistor turns on.

5. The amplifier circuitry of claim 1 including a comparator having a first input coupled to cause an output of the comparator to indicate when the first pump capacitor is nearly fully charged, and circuitry responsive to the output of the first comparator for reducing an amount of current flowing into a first supply voltage terminal of the first integrator amplifier.

6. The amplifier circuitry of claim 1 wherein a second input of the first integrator amplifier is coupled to a mid-range reference voltage and wherein a protection diode is coupled between the first and second inputs of the first integrator amplifier.

7. The amplifier circuitry of claim 1 wherein the first amplifier circuitry includes first pump capacitor recharging circuitry for further recharging of the first pump capacitor after it has been partially recharged by the first integrator amplifier following the second ramping interval.

8. The amplifier circuitry of claim 7 wherein the first pump capacitor recharging circuitry includes recharging current source circuitry coupled between the second terminal of the first pump capacitor and the second supply voltage for further recharging the first pump capacitor.

9. The amplifier circuitry of claim 8 wherein the first pump capacitor recharging current source circuitry includes a current source producing a recharging current for the further recharging of the first pump capacitor.

10. The amplifier circuitry of claim 1 wherein the first current source circuitry includes first current mirror circuitry and the second current source circuitry includes second current mirror circuitry, and wherein the switching circuitry includes a first switch having a pole terminal coupled to one terminal of a bias current source and a first terminal coupled to the input of the first current mirror circuitry, and a second switch having a pole terminal coupled to another terminal of the bias current source and a first terminal coupled to the input of the second current mirror circuitry.

11. The amplifier circuitry of claim 10 including second amplifier circuitry including
   1) a second integrator amplifier and associated second integrating capacitor, and
   2) a second pump capacitor having a first terminal coupled to the second supply terminal of the driver amplifier and a second terminal coupled to an output of the second integrator amplifier.

12. The amplifier circuitry of claim 11 wherein the input circuitry includes third current mirror circuitry having an input coupled to the switching circuitry and an output coupled to a first input of the second integrator amplifier, and fourth current mirror circuitry having an input coupled to the switching circuitry and an output coupled to the first input of the second integrator amplifier.

13. The amplifier circuitry of claim 1 wherein the second ramping interval is substantially greater than the first ramping interval.

14. The amplifier circuitry of claim 1 wherein the control signal is generated by an external processor to indicate an imminent peak of the input signal.

15. A method for operating amplifier circuitry powered by a first supply voltage and a second supply voltage to process high magnitude peak voltages of an input signal, the method comprising:

(a) ramping a first output signal of a first integrator amplifier of the amplifier circuitry in a first direction during a first ramping interval in anticipation of a high magnitude peak level of the input signal;
(b) coupling the first output signal produced by the first integrator amplifier during the first ramping interval through a pass transistor to a first terminal of a first pump capacitor to discharge the first pump capacitor into a first terminal of a driver amplifier to boost a first supply voltage thereof;
(c) amplifying a first-polarity high magnitude peak level of the input signal by means of the driver amplifier after the boosting;
(d) ramping the first output signal of the first integrator amplifier in a second direction during a second ramping interval after the amplifying; and
(e) coupling a second terminal the first pump capacitor to the first supply voltage by means of a first switch following the ramping to cause the first integrator amplifier to recharge the first pump capacitor during the second ramping interval.

16. The method of claim 15 wherein the first integrating capacitor is coupled between an output of the first integrating amplifier and the first input of the first integrator amplifier, the method including limiting low excursions of the first output signal to a level just sufficient to turn the pass transistor off during the recharging of the first pump capacitor.

17. The method of claim 15 including determining when the first pump capacitor is nearly fully charged and then reducing an amount of current flowing into a first supply voltage terminal of the first integrator amplifier.

18. The method of claim 15 including topping off the recharging of the first pump capacitor by means of a current source after the first pump capacitor has been partially recharged by the first integrator amplifier following the second ramping interval.

19. The method of claim 15 including
   ramping a first output signal of the a second integrator amplifier in a second direction during the first ramping interval in anticipation of a second-polarity high magnitude peak level of the input signal;
   coupling a signal representative of the first output signal produced by the second integrator amplifier during the first ramping interval to a second terminal of a second pump capacitor to discharge the second pump capacitor into a second terminal of the driver amplifier to boost a second supply voltage thereof;
   amplifying the second-polarity high magnitude peak level of the input signal by means of the driver amplifier after the boosting of the second supply voltage;
   ramping the second output signal of the second integrator amplifier during the second ramping interval after the amplifying of the second-polarity high magnitude peak level of the input signal; and
   coupling a second terminal the second pump capacitor to the second supply voltage by means of a second switch following that ramping to cause the second integrator amplifier to recharge the second pump capacitor following the second ramping interval.

20. Amplifier circuitry powered by a first supply voltage and a second supply voltage to process high magnitude peak voltages of an input signal, the amplifier circuitry comprising:
(a) means for ramping a first output signal of a first integrator amplifier of the amplifier circuitry in a first direction during a first ramping interval in anticipation of a high magnitude peak level of the input signal;

(b) means for coupling the first output signal produced by the first integrator amplifier during the first ramping interval through a pass transistor to a first terminal of a first pump capacitor to discharge the first pump capacitor into a first terminal of a driver amplifier to boost a first supply voltage thereof;

(c) means amplifying the high magnitude peak level of the input signal by means of the driver amplifier after the boosting;

(d) means for ramping the first output signal of the first integrator amplifier in a second direction during a second ramping interval; and (e) means for coupling a second terminal the first pump capacitor to the first supply voltage by means of a first switch to cause the first integrator amplifier to recharge the first pump capacitor following the second ramping interval.

* * * * *